(12) United States Patent
Tittel

(10) Patent No.: US 7,129,880 B2
(45) Date of Patent: Oct. 31, 2006

(54) AUTO-ZOOM SLOPED ADC

(75) Inventor: Paul A. Tittel, Columbia, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/179,604

(22) Filed: Jul. 13, 2005

(65) Prior Publication Data

US 2006/0028360 A1 Feb. 9, 2006

Related U.S. Application Data

(60) Provisional application No. 60/599,570, filed on Aug. 9, 2004.

(51) Int. Cl.
*H03M 1/12* (2006.01)
(52) U.S. Cl. ..................... 341/155; 382/276
(58) Field of Classification Search ................ 341/155, 341/169; 382/276, 299
See application file for complete search history.

(56) References Cited

U.S. PATENT DOCUMENTS

| 4,349,887 | A | * | 9/1982 | Crowley | 708/103 |
| 4,771,279 | A | * | 9/1988 | Hannah | 345/559 |
| 5,117,201 | A | * | 5/1992 | Luther | 330/279 |
| 2004/0221187 | A1 | * | 11/2004 | Durand et al. | 713/300 |

OTHER PUBLICATIONS

An 86 m W, 80 Msample/sec, 10-bit Pipeline ADC, Project Paper, EECS 598 Mixed-Signal Circuit Design, F2002, Michael S. Chang and Kaiann L. Fu, Students, pp. 1-7.

Low Power CMOS Dynamic Latch Comparators, Patheera Uthaichana and Ekachai Leelarasmee, Chulalongkorn University, Electrical Engineering Department, 07-803-7651-X/03/ 2003 IEEE, pp. 1-4.
CMOS Dynamic Comparators For Pipeline A/D Converters, Lauri Sumanen, Mikko Waltari, Vaino Hakkarainen, Kari Halonen, Helsinki University of Technology, Electronic Circuit Design Laboratory, 0-7803-7448-7/02 IEEE 2002, pp. V-157-V-160.
A 10-b 20-Msample/s Analog-to-Digital Converter, Stephen H. Lewis, Member, IEEE, H. Scott Fetterman, George F. Gross, Jr., R. Ramachandran, Member, IEEE, and T.R. Viswanathan, Senior Member, IEEE, IEEE Journal of Solid-State Circuits, vol. 27, No. 3, Mar. 1992, pp. 351-358.
A Nyquist-Rate Pixel-Level ADC for CMOS Image Sensors, David X. D. Yang, Boyd Fowler, and Abbas El Gamal, IEEE Journal of Solid-State Circuits, vol. 34, No. 3, Mar. 1999, pp. 348-356.
CMOS Image Sensors: Electronic Camera On A Chip, Eric R. Fossum, Center for Space Microelectronic Technology, Jet propulsion Laboratory, California Institute of Technology, IEEE, 1995, pp. 1.3.1 to 1.3.9.

* cited by examiner

*Primary Examiner*—Peguy JeanPierre
(74) *Attorney, Agent, or Firm*—Birch, Stewart, Kolasch & Birch, LLP

(57) ABSTRACT

The operating characteristics of a dynamic comparator is used to automatically change the resolution of a sloped or ramped analog-to-digital converter (ADC) by switching the comparator on and off between first (slow) and second (fast) clock frequencies and comparing the amplitude of a sampled input signal against a ramp input signal. The slow clock frequency is first used to determine the area of interest, while the fast clock frequency is then used to zoom into a high resolution area of interest.

16 Claims, 3 Drawing Sheets

AUTO-ZOOM SLOPED ADC

This application claims priority of Provisional application Ser. No. 60/599,570, filed Aug. 9, 2004, entitled "Auto-Zoom Sloped ADC".

BACKGROUND OF THE INVENTION

1. Field of the Invention

This invention relates generally to analog to digital converters (ADCs) and more particularly to an ADC including a dynamic comparator circuit.

2. Description of Related Art

On-chip analog-to-digital converters (ADCs) are currently being utilized for simplifying systems, reducing system power and reducing system weight. CMOS image sensors, moreover, have been widely accepted for visible imaging applications since they enable easy integration of on-chip ADCs. CMOS image sensors typically consist of an array of passive or active pixel sensors (APS) which are particularly adapted for parallel processing. The ADC architecture can consist of one ADC per chip down to one ADC per pixel. The single ADC per chip operates at high speeds while the ADC per pixel operates at the frame rate. A good compromise has been found to have one ADC per column. With such an approach, ADCs are needed which fit in a column's width, in the order of approximately 10 µm, and operate at a row repetition rate.

Sloped or ramped ADCs are also well known in the art and operate at row rates and take up minimal chip area. These converters have been used in conventional CMOS image sensors and can meet the required row rates and layout area. A sloped ADC uses a single dynamic comparator to compare the input signal voltage level to a ramp voltage signal. Once the ramp voltage passes the amplitude of the input signal, the comparator latches the ramp's count value into one or more memory cells which are later read off the chip in binary fashion.

An inherent limitation of a sloped ADC, however, has been in the comparator. If the ADC is operating at a frequency f, the ADC digitizing time is 1/f. For an N bit ADC, the comparator has $1/[f(2^n-1)]$ seconds for each comparison and hence needs a bandwidth of $f(2^n-1)$. Similarly, the gain of the comparator needs to be doubled for each bit of resolution. For each additional bit of resolution, the gain bandwidth product (GBP) of the comparator quadruples, and the ADC begins to require a considerable increase in power. Therefore, for high resolution and fast frame active pixel sensor (APS) arrays, a sloped ADC heretofore has been less appealing. For example, a 600×600 APS array, operating at 30 frames/sec., will have an 18 kHz row rate. Since time is needed to sample and hold the input, the ADC will have a sample rate on the order of 22 kHz. For 12 bits of resolution, the comparator will need to switch at approximately 90 Mhz.

Dynamic comparators, however, have been found to offer a desirable solution to the power problem in that they require only a small area, are fast, and use relatively low power. As such, they become a desirable component in an ADC. High speed and gain can also be achieved by using positive feedback, which is also well known in the art.

Dynamic comparators have a reset time and a latch time. During reset, the input is sampled, while during latch, the comparator swings to predetermined output levels. It is to be noted that power is dissipated only when the clock signal applied switches on or off. Thus, average power $P_{ave}$ is proportional to frequency f, i.e., $P_{av}=CV^2f$, where f is the switch rate (clock frequency). When desired, some quasi-dynamic comparators use a small amount of bias current to help with the input sampling.

SUMMARY

Accordingly, it is the primary object of the present invention to provide an improvement in analog-to-digital converters utilizing dynamic comparators.

This is achieved by automatically changing the operating characteristics of the dynamic comparator used in connection with sloped or ramped analog-to-digital converters (ADC) by switching the comparator on and off between first (slow) and second (fast) clock frequencies by comparing the amplitude of a sampled input signal against a ramp input signal and thereby automatically change the resolution of the ADC. The slow clock frequency is first used to determine the area of interest, while the fast clock frequency is then used to zoom into a high resolution area of interest.

This as well as other objects of the present invention will become apparent from the detailed description provided hereinafter. It should be understood, however, that the detailed description and specific example, which indicates the preferred embodiment of the invention, is given by way of illustration only, since various changes and modifications coming within the spirit and scope of the invention will become apparent to those skilled in the art.

BRIEF DESCRIPTION OF THE DRAWINGS

The present invention will become more fully understood from the following detailed description and the accompanying drawings which are provided by way of illustration only, and thus are not meant to be considered in a limiting sense and, wherein.

DETAILED DESCRIPTION OF THE INVENTION

Before discussing the details of the subject invention, reference will first be made to FIGS. 1 and 2 which are illustrative of an image sensor which includes a dynamic ramp comparator for each column of pixels of the array.

Figure 1:
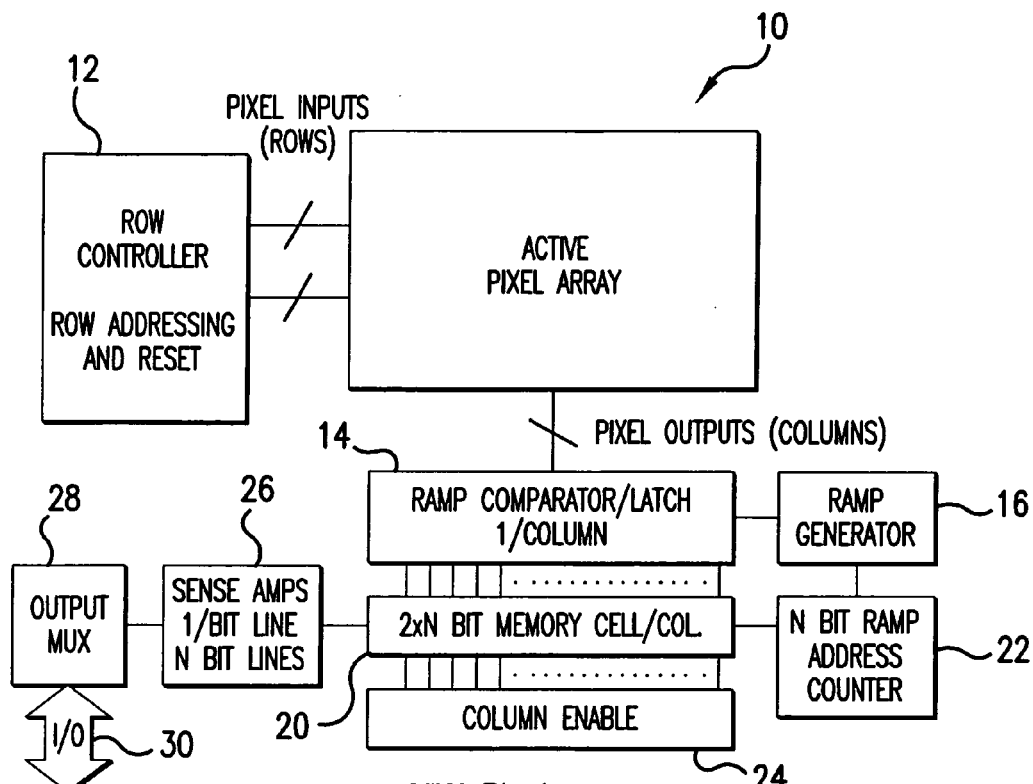
FIG. 1 is a block diagram illustrative of a conventional CMOS image sensor consisting of an array of active pixel sensors including one ramp comparator of an ADC for each column of the array.

The sensor as shown in FIG. 1 comprises, for example, a CMOS image sensor 10, consisting of rows and columns of active pixel sensors, not shown. Examples of CMOS image sensors are further shown and described in a publication entitled "CMOS Image Sensors: Electronic Camera on a Chip", E. R. Fossum IEDM 95, pp. 17–25 of the IEEE. In FIG. 1, a row controller 12 controls pixel inputs to rows of pixels in the array 10 which are outputted in columns to individual ramp comparators 14 which receive a ramp signal from a ramp signal generator 16. Each ramp comparator 14 feeds into a respective 2×N bit memory cells 20 which are controlled by an N-bit ramp address counter 22 and a column enable circuit 24. Each individual memory cell of the 2×N bit memory cells feed to individual sense amplifiers 26 (1/bit line) which are coupled to an output multiplexer 28 which feeds an output bus 30.

Figure 2:
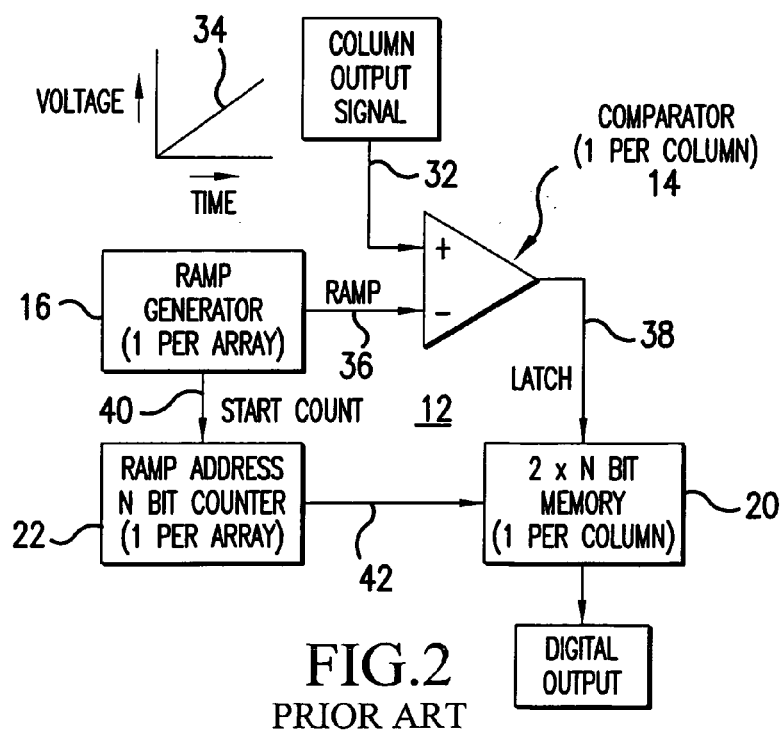
FIG. 2 is a block diagram illustrative of a conventional sloped analog-to-digital converter (ADC) forming part of the sensor shown in FIG. 1.

The sensor 10 in FIG. 1 includes elements of a sloped/ramped ADC such as shown in FIG. 2 and uses successive comparisons between the amplitude of a pixel signal and voltage ramp. The binary value of the ramp is stored in the memory cells 20 which is then output one bit at a time simultaneously from all memory cells of the image sensor.

As shown in FIG. 2, each comparator/latch 14 receives the respective column output signal on an individual signal lead 32 which is applied, for example, to the (+)input to the comparator 14. A ramp voltage signal generated by the ramp generator 16 (FIG. 1) is fed to the (−) input to the comparator 14 by way of a signal lead 36. When the amplitude of the column output signal on lead 32 equals the ramp voltage on lead 36, the comparator 14 latches and feeds a digital control signal into a respective N bit memory cells 20 on lead 38. The ramp generator 16 is coupled to the ramp address counter 22, for example, via lead 40 which enables the start of the ramp addresss counter 22. The ramp address counter 22 is also coupled to the N bit memory cells 20 through an N bit bus 42. When a particular comparator 14 latches, the bnary ramp count value gets stored in the corresponding memory cells 20. By comparing the pixel output on signal lead 32 verses the ramp signal on lead 36, the comparator 14 latches the corresponding ramp count value on signal bus 42 into the N bit memory cells 20.

Figure 3:
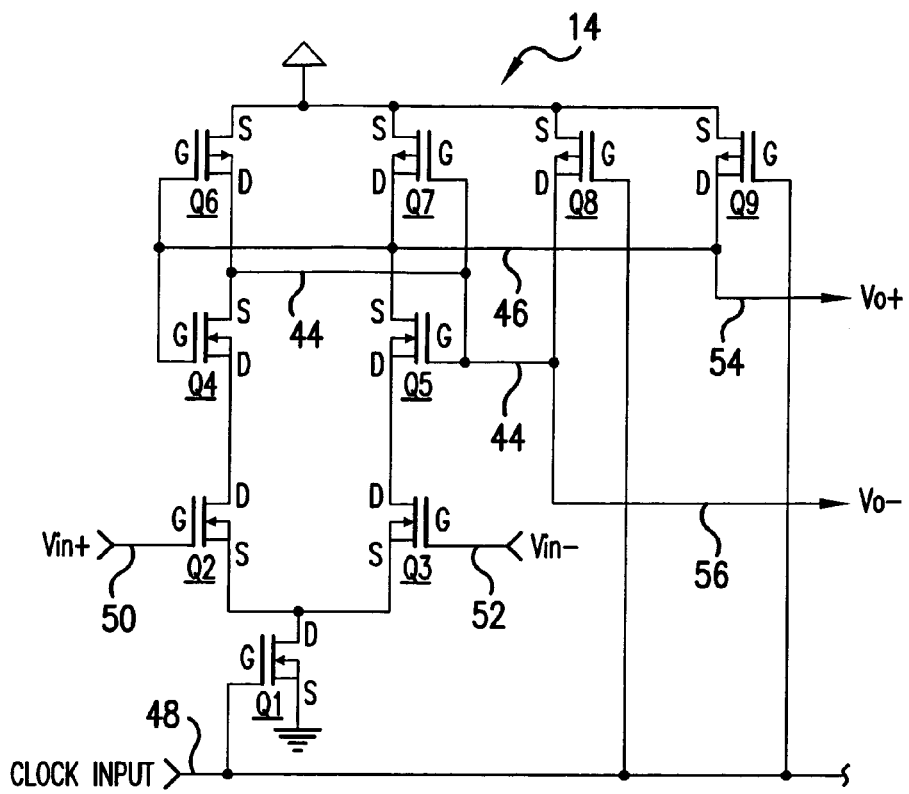
FIG. 3 is an electrical schematic diagram illustrative of a dynamic comparator.

A typical dynamic latch comparator 14 circuit is shown, for example, in FIG. 3 and comprises a CMOS circuit including an assembly p-type and n-type CMOS field effect transistors (MOSFETs) Q1–Q9. In addition to a clock input gate MOSFET Q1, the circuit includes first and second input signal MOSFETs Q2 and Q3. The drain D of MOSFET Q2 is connected to a pair of series connected or cascoded complementary MOSFETs Q4 and Q6, while the drain D of the other input MOSFET Q3 is connected to a pair of series connected MOSFETs Q5 and Q7. The pairs of MOSFETs Q4, Q6 and Q5, Q7 are cross coupled and form a positive feedback latch circuit such that the gate electrodes G of MOSFETs Q5 and Q7 are commonly connected to the drain D of MOSFET Q6 and the source S of MOSFET Q4 by signal lead 44, while the gate electrodes G of Q4 and Q6 are commonly connected to the drain D of MOSFET Q7 and the source S of MOSFET Q5 via signal lead 46. The gate electrodes of the reset MOSFETs Q8 and Q9 are connected to a clock input lead 48 which is also connected to the gate electrode of the gate G of MOSFET Q1. The drains D of MOSFETs Q8 and Q9 are tied through signal leads 44 and 46 respectively to the gates of the positive feedback latch consisting of Q4, Q6 and Q5, Q7. Input signal voltages $V_{in+}$ and $V_{in-}$ for comparison, are connected to the gate electrodes G of MOSFETs Q2 and Q3 via signal leads 50 and 52. A pair of output signals $V_0+$ and $V_0-$ are provided on circuit leads 54 and 56 which are respectively common to the leads 46 and 44 which provides positive feedback to the MOSFETs Q4, Q6 and Q5, Q7, respectively.

The basic operation of the dynamic comparator shown in FIG. 3 is as follows. During reset, the clock input signal on lead 48 is low (binary 0) and the $V_0+$ and $V_0-$ voltages on leads 54 and 56 are pulled high (binary 1) by the CMOS devices Q8 and Q9. With the outputs $V_0+$ and $V_0-$ being high, the gates of the cross coupled latch consisting of Q4, Q6, and Q5, Q7 are set to an equivalent value. Q6 and Q7 are off, i.e. in a non-conductive state, while Q4 and Q5 are on in a conductive state. When the clock input signal on lead 48 switches high (binary 1), Q1 begins to conduct current and the difference signal between Q2 and Q3 is amplified through the cross coupled latch configured by Q4, Q6 and Q5, Q7. The positive feedback provided by Q4, Q6 and Q5, Q7 enables the output voltages $V_0+$ and $V_0-$ to switch quickly, whereupon the output signals $V_0+$ and $V_0-$ switch to opposite supply rails so as to provide complementary binary 1 and 0 outputs $V_0+$ and $V_0-$, respectively.

Figure 4:
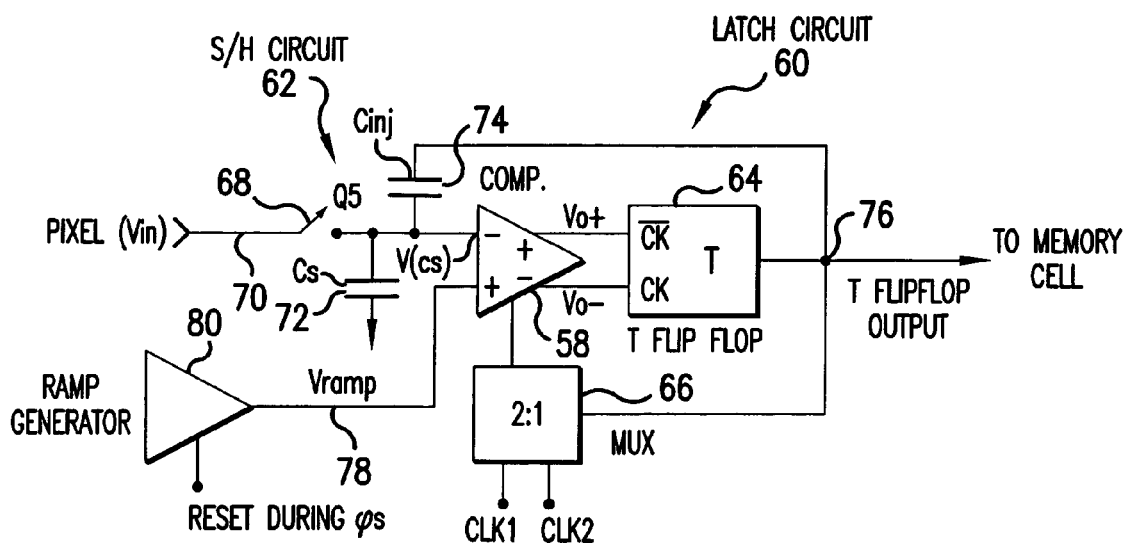
FIG. 4 is an electric block diagram of an ADC including a dynamic comparator in accordance with the preferred embodiment of the invention.

With this background, reference is now made to FIG. 4 which discloses the preferred embodiment of a sloped ADC in accordance with the subject invention and which includes a dynamic comparator 58 which is switched between first and second clock signals, i.e., a slow (Clk1) and a fast (Clk2) clock signal for automatically changing the resolution of the ADC to save power. Clk1 is used to determine the area of interest, while Clk2 is used to zoom into a high resolution area of interest. The ADC 58 shown in FIG. 4 utilizes the characteristic of dynamic comparators and capacitive coupling for inclusion in a latch circuit 60 and a sample and hold circuit 62. The latch circuit 60 is shown comprising in addition to the dynamic comparator circuit 58, a flip-flop circuit 64, and a clock multiplexer 66. The sample and hold circuit 62 includes a signal sampling switch 68 located in an input signal lead 70, a voltage sampling capacitor 72 connected between the switch 68 and ground potential so as to apply the sampled voltage to the (−) input to the comparator 58 and a feedback capacitor $C_{inj}$ 74 coupled from the output terminal 76 to the (−) input to the comparator 58. Further as shown in FIG. 4, the signal to the (+) input to the comparator 58 comprises a positive going linear ramp signal $V_{ramp}$ applied to the output lead 78 of ramp generator 80.

Figure 5:
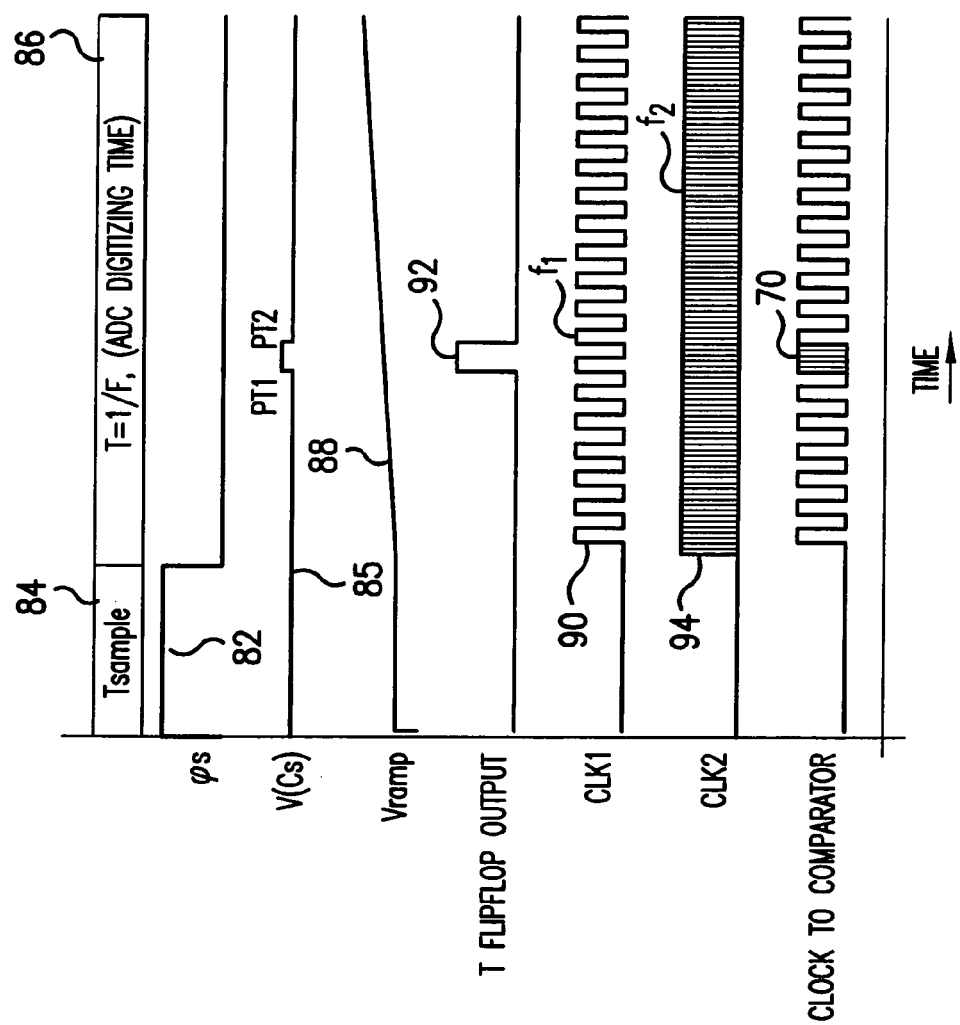
FIG. 5 is a set of waveforms illustrative of the operation of the dynamic comparator shown in FIG. 4.

The operation of the ADC shown in FIG. 4 will be understood when considered together with the waveforms as shown in FIG. 5, which are all referenced to the same time line. Considering now the waveforms of FIG. 5, an input voltage on line 70 shown in a binary high state 82 is applied to the capacitor 72 when the Qs switch 68 is closed during a sampling period 84. Thereafter the switch 68 is opened and an ADC digitizing time period takes place as shown by reference numeral 86 whereupon a positive going ramp voltage 88 is applied to signal lead 78 (FIG. 4). A slow clock signal Clk1 having a frequency f1 as shown by reference numeral 90 is first applied to the comparator 58 through the multiplexer 66 shown in FIG. 4. When the ramp voltage 88 is equal to the sampled voltage at point pt1, the flip-flop circuit 64 is triggered, causing its output at circuit node 76 to go high (binary 1) as shown by reference numeral 92. At that point in time, the clock multiplexer 66 is switched and a fast clock signal Clk 2 as shown by reference numeral 94, having a frequency $f_2$, is supplied to the comparator 58. A voltage feedback from the flip-flop 64 to the comparator 58 via the capacitor 74 resets the flip-flop after a predetermined time interval and the slow clock signal Clk1 is again applied.

It should be noted that power is dissipated in the comparator circuit only when the clock signal switches on the circuit or off. Since the average power is proportional to frequency to obtain high resolution in the output the comparator must be switched rapidly. Thus increased resolution requires an increase in frequency, resulting in increased use of power.

Accordingly, the present invention employs two clock signals, a slow clock signal Clk1 and a fast clock signal Clk2. The slow clock Clk1 is used to determine the area of interest while dissipating a relatively low amount of power. Then the fast clock Clk2 is applied to the comparator to zoom in the area of interest to produce high resolution which requires more power. Thereafter, the slow clock Clk1 is reapplied.

The dynamic power of the comparator shown in FIG. 4 can be reduced to $2/2^{m/2}$ of the original power with this technique, where m is the number of bits of the ADC. For a 12 bit ADC, this means that only 3.125% of the original power using only clock Clk2 is needed. Thus, the invention automatically changes the resolution of the ADC while saving power by switching between the slow clock Clk1 and the fast clock Clk2.

The following description is intended to demonstrate that the dynamic power of the comparator shown in FIG. 4 can be reduced with the use of Clk1 and Clk2.

In general, the average power of the input comparator can be stated as:

$$P_{ave}=CV^2 f \qquad (1)$$

Where C is the parasitic capacitance of the comparator and the load, V is the supply voltage, and f is the switching frequency. For any given amplifier C and V are constant. Therefore, the average power can be written as:

$$P_{ave}=K \times f \qquad (2)$$

Where $K=CV^2$.

The comparator continuously samples the ramp value of the $V_{ramp}$ voltage 88 shown in FIG. 5 and compares it to the input V(Cs) shown by reference numeral 85; however, it only needs to operate quickly at the instance in time when it switches. As noted above, the low frequency clock signal shown by reference numeral 90 and having a frequency $f_1$ is used to automatically zoom into the area of interest at point pt. 1. Once the area of interest is reached, the high frequency clock Clk2 as shown by reference numeral 94 and having the frequency of $f_2$, is used to increase the resolution of the ADC.

A new average power $P_{ave}$ will now be the sum of the average power during the slow clock frequency $f_1$ plus the average power of the fast frequency clock $f_2$ during the time that it is operational, i.e., the period 86 which is $1/(T \times f)$ as shown in FIG. 5.

The new average power $P'_{ave}$ is now defined as:

$$P'_{ave}=K \times f_1 + (1/T) \times (1/f_1) \times f_2 \times K \qquad (3)$$

Where, T is the ADC digitizing time, $f_2$ is the fast clock Clk2 frequency and is equal to $2^m/T$, where m equals the number of bits, $f_1$ is the slow clock (Clk 1) frequency $f_1$, and K is equal to $CV^2$. Substituting for $f_2$, $P'_{ave}$ can now be expressed as:

$$P'_{ave}=K \times f_1 + (1/T) \times (1/f_1) \times 2^m/T \times K \qquad (4)$$

By differentiating equation (4) with respect to $f_1$ and solving for the minimum, the following expression is obtained:

$$d(P'_{ave})/df_1 = K - K2^m/T^2 f_1^2 = 0 \qquad (5)$$

where, $$f_1 = 2^{m/2}/T \qquad (6)$$

Substituting equation (6) into equation (4), $$P'_{ave} = K2^{m/2}/T + K2^m T/T^2 2^{m/2} = K(2 \times 2^{m/2})/T \qquad (7)$$

The percent of the original power can be found by dividing equation (7) by (4) so that, $$P'_{ave}/P_{ave} \times 100\% = K(2 \times 2^{m/2})/T \times T/K(2^m) \times 100\% = 2/(2^{m/2}) \times 100\% \qquad (8)$$

Thus, what has been showed and described is a power reduction technique for sloped analog-to-digital converters (ADC) which are commonly used in CMOS imagers. For sloped ADCs, the fundamental speed/resolution of the ADC is determined by the comparator. For fast/high resolution applications, the comparators' power can become costly. However, by utilizing the characteristics of the dynamic comparator with capacitive coupling, the dynamic power of the decision comparator can be reduced to $2/2^{m/2}$ of the original power, where m is equal to the number of bits. This is approximately 3% for a 12 bit ADC.

The invention being thus shown and described, it will be obvious that the same may be varied in many ways. However, such variations are not to be regarded as a departure from the spirit and scope of the invention. Therefore, all such modifications as would be obvious to one skilled in the art are intended to be included within the scope of the following claims.

The invention claimed is:

1. A method of reducing the power consumption of a latch type dynamic comparator operating in response to a clock signal comprising the steps of:
    applying a clock signal having a first clock frequency and consuming a relatively small amount of power during one portion of a signal comparison time period; and,
    applying a clock signal having a second clock frequency and consuming a relatively larger amount of power during another portion of the signal comparison time period, and
    wherein the first clock frequency is applied to determine a first resolution area of interest and the second clock frequency is applied to determine a second resolution area of interest.

2. The method of claim 1 wherein the first resolution area of interest comprises a relatively low resolution area of interest and the second resolution area of interest comprises a relatively high resolution area of interest.

3. The method of claim 2 wherein the first frequency is lower than the second frequency.

4. The method of claim 1 wherein the dynamic comparator forms part of an analog to digital converter.

5. The method of claim 4 wherein the first clock frequency is lower than the second clock frequency and wherein the first resolution area of interest is one of relatively low resolution and the second resolution area of interest is one of relatively high resolution.

6. The method of claim 5 wherein the analog to digital converter comprises a sloped converter and the dynamic comparator includes first and second signal input terminals, and further comprising the steps of applying a sample of an input signal to the first input terminal and applying an amplitude varying signal to the second input terminal and switching from the first clock frequency to the second clock frequency when the amplitude of the amplitude varying signal is substantially equal to the amplitude of the sample of the input signal, thereby switching from the low resolution area of interest to the high resolution area of interest.

7. The method of claim 6 wherein the amplitude varying signal comprises a ramp voltage signal and the comparator switches from a reset state to a latched state when the ramp voltage signal is substantially equal to the sample of the input signal.

8. The method of claim 7 and additionally including the step of applying a feedback signal from an output terminal to the first terminal for switching the comparator from the latched state back to the reset state.

9. The method of claim 8 wherein the input signal comprises a pixel output signal from the CMOS image sensor.

10. The method of claim 9 wherein the image sensor comprises an array of passive or active pixel sensors.

11. A dynamic signal comparator for an analog to digital converter comprising:
   a latch type comparator circuit responsive to a clock signal applied to a clock signal input terminal, a first input terminal for receiving a first input signal having a substantially constant amplitude, a second input terminal for receiving a second input signal having a varying amplitude, and at least one output terminal providing an output signal having an amplitude which switches to a latched value when the amplitude of the input signal of varying amplitude is substantially equal to or greater than the amplitude of the substantially constant amplitude input signal and a clock signal input terminal for receiving a first and a second clock signal; and
   a circuit for applying the first clock signal having a relatively low frequency to the comparator when the amplitude of the second input signal is less than the amplitude of the first input signal and for applying the second clock signal having a relatively high frequency when the amplitude of the second input is substantially equal to or greater than the amplitude of the first input signal, and
   a feedback circuit coupled from the output terminal to the first input terminal for resetting the comparator circuit following a switch to the latched value.

12. The dynamic signal comparator according to claim 11 wherein said input signal having a varying amplitude comprises a ramp signal.

13. The dynamic signal comparator according to claim 12 and additionally including a sample and hold circuit including a signal sampling capacitor connected across the first input terminal.

14. The dynamic signal comparator according to claim 12 wherein the feedback circuit includes a bistable switch circuit connected between the at least one output terminal and the first input terminal and being triggered by the latched value of the output signal for resetting the comparator.

15. The dynamic signal comparator according to claim 14 wherein the circuit for applying the first and second clock signals is controlled by an output signal from the bistable switch circuit.

16. The dynamic signal comparator according to claim 15 wherein the bistable switch circuit comprises a flip-flop circuit.

* * * * *